United States Patent [19]

Hartman

[11] 4,234,851
[45] Nov. 18, 1980

[54] LOGARITHMIC LOCK-IN AMPLIFIER

[75] Inventor: Richard L. Hartman, Huntsville, Ala.

[73] Assignee: The United States of America as represented by the Secretary of the Army, Washington, D.C.

[21] Appl. No.: 972,179

[22] Filed: Dec. 21, 1978

[51] Int. Cl.³ .......................... H03F 3/10; G06G 7/12
[52] U.S. Cl. .................................... 328/145; 328/143; 330/110; 330/284; 307/230
[58] Field of Search ............... 328/145, 144, 143, 142; 330/110, 284; 307/230

[56] References Cited

U.S. PATENT DOCUMENTS

| 3,128,377 | 4/1964 | Goddard | 328/145 X |
| 3,188,493 | 6/1965 | Malagari | 307/230 X |
| 3,210,680 | 10/1965 | Farris | 330/284 |
| 3,264,569 | 8/1966 | Lefferts | 330/110 X |
| 3,375,460 | 3/1968 | Miller | 330/110 X |

Primary Examiner—John S. Heyman
Attorney, Agent, or Firm—Nathan Edelberg; Robert P. Gibson; Robert C. Sims

[57] ABSTRACT

A technique for automatically varying the gain of a lock-in-amplifier with logarithmically responding diodes placed in the feedback network so that the output is proportional to the logarithm of the input. Measurement of low or high level signals without manual changes of gain is then provided.

1 Claim, 1 Drawing Figure

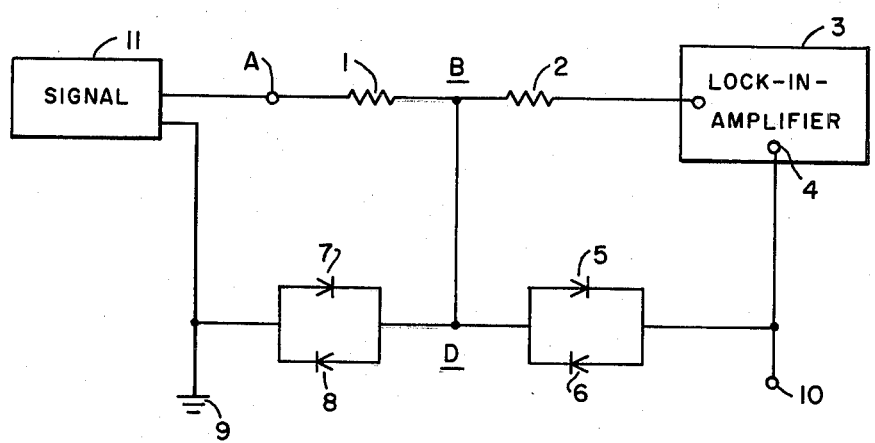

LOGARITHMIC LOCK-IN AMPLIFIER

DEDICATORY CLAUSE

The invention described herein may be manufactured, used, and licensed by or for the Government for Governmental purposes without the payment to me of any royalties thereon.

BACKGROUND OF THE INVENTION

The lock-in-amplifier is a combination of narrow band preamplification, phase sensitive detection, and DC amplification. Examples of lock-in amplifiers can be found in the "The Review of Scientific Instruments," Volume 24, number 4, (An Improved "Lock-in" Amplifier) April 1965, by Henry L. Cox, Jr., pages 307 and 308. Also Bulova American Time Products produces a Model 701 Lock-in Amplifier. It is typically used to detect very low level signals submerged in noise. The disadvantage is that in many measurements there are large and small signals. If the gain level is set to detect the small signals, the large ones overload the system. If the gain is set to detect large signals, the small ones are lost. Trial and error repetitions are required to correctly adjust.

A solution to this is to use a logarithmic amplifier. Many such slow responding amplifiers could be used after the lock-in, but then the dynamic range of the system is low. A logarithmic preamplifier can be used, but then it must be a very low noise amplifier, and the very low noise amplifier in the lock-in is wasted.

BRIEF DESCRIPTION OF THE DRAWINGS

The single FIGURE is a schematic illustration of the preferred embodiment of the present invention.

DESCRIPTION OF THE PREFERRED EMBODIMENT

A set of logarithmically responding diodes is placed in a feedback network across the output to input of the lock-in. This makes a fast responding system which requires no external amplifiers, no power supplies, and thus is much cheaper than external approaches.

Referring to the FIGURE, the input signal at A passes through a pair of resistors 1 and 2 into the lock-in-amplifier 3. As long as the values 1 and 2 are much lower than the source resistance, no degradation of performance occurs. The DC output 4 of the lock-in-amplifier is impressed across the two semiconductor diode pairs 5, 6, 7 and 8 to ground 9. The output signals are still available at terminal 10.

The attenuation of the network of B and D depends on the ratio of the resistance of 1 and 2 to that of 5-8. Like all semiconductor diodes, their resistance varies with the voltage impressed across it. At low voltages, the resistance is roughly proportional to the logarithm of the impressed voltage. In this case, the DC output from 4 is so much larger than the input signal from A that the output 4 alone sets the resistance and, thus, the attenuation of the network. Since the input to lock-in-amplifier 3 is a narrow band AC amplifier, the DC signal impressed on it has no affect. If the input signal 11 at A is DC coupled, a blocking capacitor can easily be inserted. When a low signal is present at A, the output voltage from 4 is low, the resistance of the diodes is high, and the signal passes through unattenuated by any appreciable voltage drop across resistor 1, as little current is flowing therethrough. When a large signal is present at A, the output from 3 rises. This lowers the resistance of the diodes and attenuates the input signal due to the current flow through resistor 1, shunt BD to ground. This suppresses output signal 4 so that an input ten times bigger gives an output only twice as big, an input one hundred times bigger gives three times the output, and an input one thousand times bigger gives four times the output.

I claim:

1. An amplifying system comprising a signal having an output connected between a first terminal and ground; a locked-in amplifier having an input and an output; first and second impedance means connecting said first terminal in a series circuit to said input of said amplifier; a first junction between said first and second impedance means; first and second variable impedance means connecting said output of said amplifier in a series circuit to said ground connection; a second junction between said variable impedance means; connecting means connecting said first and second junctions directly to each other; said variable impedance means have an impedance that is directly proportional to the logarithmic value of the impressed voltage across them, whereby the output of said amplifier will be a logarithmic amplification of said signal; and said first and second variable impedance means being diodes.

* * * * *